(12) United States Patent
Joshi et al.

(10) Patent No.: US 7,355,906 B2
(45) Date of Patent: Apr. 8, 2008

(54) SRAM CELL DESIGN TO IMPROVE STABILITY

(75) Inventors: Rajiv V. Joshi, Yorktown Heights, NY (US); Yue Tan, Fishkill, NY (US); Robert C. Wong, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 128 days.

(21) Appl. No.: 11/420,049

(22) Filed: May 24, 2006

(65) Prior Publication Data

US 2007/0274140 A1 Nov. 29, 2007

(51) Int. Cl.
*G11C 7/00* (2006.01)

(52) U.S. Cl. .................. 365/189.11; 365/188; 365/63

(58) Field of Classification Search ........... 365/189.11, 365/188, 63
See application file for complete search history.

(56) References Cited

U.S. PATENT DOCUMENTS

| | | | |
|---|---|---|---|
| 5,774,411 A | 6/1998 | Hsieh et al. | |
| 5,923,582 A * | 7/1999 | Voss | ........................ 365/154 |
| 6,091,626 A * | 7/2000 | Madan | ........................ 365/154 |
| 6,341,083 B1 | 1/2002 | Wong | |
| 6,507,511 B1 | 1/2003 | Barth, Jr. et al. | |
| 6,510,076 B1 | 1/2003 | Lapadat et al. | |
| 6,552,941 B2 | 4/2003 | Wong et al. | |
| 6,888,741 B2 | 5/2005 | Wong | |
| 6,920,061 B2 | 7/2005 | Bhavnagarwala et al. | |
| 6,934,182 B2 | 8/2005 | Chan et al. | |
| 7,019,999 B1 * | 3/2006 | Srinivasan et al. | ........... 365/49 |
| 2005/0063232 A1 | 3/2005 | Chan et al. | |
| 2005/0078508 A1 | 4/2005 | Chan et al. | |
| 2007/0025140 A1 * | 2/2007 | Redwine | ..................... 365/154 |

* cited by examiner

*Primary Examiner*—Tuan T. Nguyen
(74) *Attorney, Agent, or Firm*—Scully, Scott, Murphy & Presser, P.C.; Joseph P. Abate, Esq.

(57) ABSTRACT

A novel semiconductor SRAM cell structure that includes at least two pull-up transistors, two pull-down transistors, and two pass-gate transistors. In one embodiment, an 8T SRAM cell structure implements a series gating feature for implementing Column Select (CS) and Row Select (WL) cell storage access with enhanced stability. Particularly, the 8-T approach adds two pass-gates, two series connected transistor devices connected at complementary nodes of two cross-coupled inverters, to control column select and row (word) select. In the other embodiment, a 9T SRAM cell structure includes a transmission gate to implement Column Select (CS) and Row Select (WL) cell storage access with enhanced stability. The 9-T approach adds three transistors to perform ANDING function to separate the row select and column select signal functions. Both methods improve stability by eliminating half-select mode and facilitate rail to rail data transfer in and out of the SRAM cell without disturbing the other cells.

18 Claims, 3 Drawing Sheets

SRAM CELL DESIGN TO IMPROVE STABILITY

FIELD OF THE INVENTION

This invention relates to semiconductor devices that comprise static random access memory (SRAM) cells, and more specifically to semiconductor devices that comprise SRAM cell structure having significantly enhanced cell stability.

BACKGROUND OF THE INVENTION

A static random access memory (SRAM) is a significant memory device due to its high speed, low power consumption, and simple operation. Unlike a dynamic random access memory (DRAM) cell, the SRAM does not need to regularly refresh the stored data and it has a straightforward design.

As shown in FIG. 1, each bit in a typical six-transistor SRAM (6T-SRAM) cell 10 is stored on four transistors, generally referred to as load transistors (or pull-up transistors) P1, P2 and driver transistors (or pull-down transistors) N1, N4, that form a flip-flop circuit containing a balanced pair of cross coupled inverters storing a single data bit. This storage cell has two stable states which are used to denote bits 0 and 1. Two additional access transistors (or pass-gate transistors) N2, N3 serve to control the access to a storage cell during read and write operations. Particularly, the pair of pass gates (e.g., a balanced pair of FETs) selectively connect the complementary outputs of the cross coupled inverter to a corresponding complementary pair of bit lines (blc, blt). A word line (WL) connected to the gates of the pass gate FETs N2, N3 selects connecting the cell to the corresponding complementary pair of bit lines.

To function properly, the SRAM cell, when charged, must hold a voltage level, either high (logic 1) or low (logic 0). When reading data from the cell, the cell current generated as the pass-gate transistor turns 'on' must not flip the voltage level at the internal cell nodes 11 and 12. To stabilize the cell, the driver or pull-down transistor is fabricated to have a higher conductance than the pass-gate transistor so that the internal node which stores logic '0' will be held low by the strong pull-down transistor.

It is known that the 6T SRAM cell 10 of FIG. 1 suffers a stability problem that is associated with a "Half-Select" operating mode. In the "Half-Select" operating mode, a Row is selected while a Column is not, i.e., the Wordline (WL) is on and one or more of the Bitline pairs is clamped to a supply or reference voltage (e.g., $V_{DD}$) as indicated (blt=1, blc=1).

Accessing a bit(s) for a read or a write operation from an SRAM array entails driving one of the word lines, turning on the pass gates for one or more cells on that word line. With the pass gates on for that selected word line, the cross-coupled cell inverters are coupled to the corresponding bit line pairs, partially selecting the cells (half selected) on that word line. Selection of one of the columns selects the cell on that word line, the bits actually being accessed. The remaining (M−1) by K bits remain half selected during the access.

During a read, each cell on the selected word line couples its contents to its corresponding bit line pair such that each of the bit line pairs may rise/droop, usually, only to develop a small difference signal (e.g., 50 mV). While the bit line pairs in the selected columns are unclamped and coupled to a sense amplifier, the half selected cells remain clamped together and to the reference voltage. At some point after sensing data for the selected bits, the word line returns low again, deselecting/isolating the cells on that word line. As long as the word line remains high, however, pass gates in half selected cells couple the reference voltage onto both storage nodes in each half selected cell. Depending upon the length of time that the word line remains high, the pass gates couple the partially selected cells tend toward an equilibrium point with the outputs of both of the cross coupled inverters (i.e., the storage nodes) being pulled toward a common voltage. This is normally a measure of cell stability, i.e., selecting the cell and clamping the bit lines to a voltage and noting the point at which the cell becomes meta-stable or switches, i.e., is upset. Unfortunately, imbalances in cell devices can upset half selected cells or at the very least to become meta-stable at normal design voltages. This instability is intolerable.

One solution that attempts to address the 6T SRAM cell stability problem include: 1) applying an offset $V_{DD}$ to the array and a peripheral. While this may sacrifice the array performance, e.g., write performance, the solution can only relieve the stability problem but cannot solve the Half-select problem; and, 2) Using an inverter to control the Column and Row select. FIG. 2 particularly depicts this prior art solution whereby an inverter device 15 comprising two added transistors T1 and T2 receive both the column select (CSC) and wordline (WL) voltage signals.

One problem with this approach is that a floating inverter output (wle) when both CS and WL are both "0" as seen from the truth table of Table 1. The floating node causes the pass-gates to leak during the time the cell is not selected. This will interfere with selected cell sensing signal.

TABLE 1

| CSC | WL | wle | Operation |
|---|---|---|---|
| 0 | 0 | Unknown | Col sel Row unsel |
| 0 | 1 | 1 | Col/Row sel |
| 1 | 0 | 0 | Col/Row unsel |
| 1 | 1 | 0 | Col unsel Row sel |

It would be highly desirable to provide a semiconductor SRAM cell structure designed to prevent the half-select mode phenomena for increased cell stability.

SUMMARY OF THE INVENTION

The present invention solves the above-described problem by providing a SRAM cell structure that eliminates the half-select phenomena for increased cell stability.

In one embodiment, an 8T SRAM cell structure implements a "Series Gating" feature for implementing Column Select (CS) and Row Select (WL) cell storage access. Particularly, the 8-T approach adds two passgates, two series connected transistor devices connected at complementary nodes of two cross-coupled inverters, to control column select and word select.

In a further embodiment, a 9T SRAM cell structure includes a "Transmission Gate" to implement Column Select (CS) and Row Select (WL). The 9-T approach adds three transistors to perform ANDING function to separate the row word select and column select signal functions. Both methods improve stability by eliminating half-select mode and facilitate rail to rail data transfer in and out of the cell. The ANDING function in 9-T approach eliminates the internal floating node (wle) as compared to known solutions.

Thus, according to one aspect, the present invention relates to a semiconductor device comprising at least one SRAM cell located in a substrate, wherein the at least one SRAM cell comprises two pull-up transistors and two pull-down transistors in cross-coupled inverter configuration for storing a single data bit, the device further comprising:

first and second pass-gate transistor devices, each having a gate terminal operable to receive a first signal for controlling access to a stored data bit;

a first switch device in series connection with one of the first or second pass-gate transistor device operable for receiving a second signal for controlling access to the stored data bit;

a second switch device in series connection with the other of the first or second pass-gate transistor device operable for receiving the second signal for controlling access to the stored data bit, wherein provision of the first and second series connected switch devices prevent half-select mode operation.

Further to this aspect of the invention, the first switch device comprises a third pass-gate transistor having a gate terminal operable for receiving the second signal, and the second switch device comprises a fourth pass-gate transistor having gate terminal operable for receiving the second signal.

In a further aspect, the present invention relates to a semiconductor device comprising at least one SRAM cell located in a substrate, wherein said at least one SRAM cell comprises two pull-up transistors and two pull-down transistors in cross-coupled inverter configuration between a power supply voltage and a ground, for storing a single data bit, said device further comprising:

first and second pass-gate transistor devices, each having a gate terminal operable to receive a single control signal for controlling access to a stored data bit;

means responsive to first and second signals for generating said single control signal in a manner to prevent half-select mode operation.

According to this further aspect, the semiconductor means responsive to first and second signals comprises a transmission gate.

In still another aspect of the invention, there is provided a memory device comprising an array of SRAM cells, the array having row select and column select signal inputs controlling access to a bit stored at a SRAM cell structure of the array, the SRAM cell structure comprising, at each a first and a complement side of the SRAM cell structure, a series connection of two pass-gate transistors for enabling access to the stored bit, wherein a first transistor of the series-connected pass-gate transistors receives the column select signal, and a second transistor of each the series-connected pass-gate transistors receives the row select signal, for enabling bit access.

Advantageously, the present invention may be implemented with SRAM cells having significantly enhanced cell stability whereby the SRAM cell is formed in a hybrid substrate, the at least one SRAM cell comprising two pull-up transistors, two pull-down transistors, and two pass-gate transistors, the two pull-down transistors are formed in one of the first and second sets of regions, the two pass-gate transistors are formed in the other of such first and second sets of regions, and the pull-down transistors and the pass-gate transistors are substantially similar in channel widths and have substantially similar source-drain doping concentrations.

Other aspects, features and advantages of the invention will be more fully apparent from the ensuing disclosure and appended claims.

DETAILED DESCRIPTION OF THE INVENTION AND PREFERRED EMBODIMENTS THEREOF

The present invention provides a novel SRAM cell structure that includes alternately, a novel 8-T SRAM cell and, a novel 9-T SRAM cell, to prevent half-select mode operation. In each embodiment, a SRAM cell structure, preferably comprising CMOS devices in cross-coupled latch configuration having pull-up transistors connected to a power supply Vdd and, a pull-down transistors connected to ground. One embodiment of a cell structure may be found in corresponding U.S. patent application Ser. No. 20050078508A1 entitled "SRAM Array with Improved Cell Stability", the contents and disclosure of which is incorporated by reference as if fully set forth herein. The transistor devices, such as semiconductor nFETs and pFETs have device features sizes that are particularly suitable for lithography-based and nano-lithographic-based manufacturing that can be used in fabricating such semiconductor devices.

Figure 3:
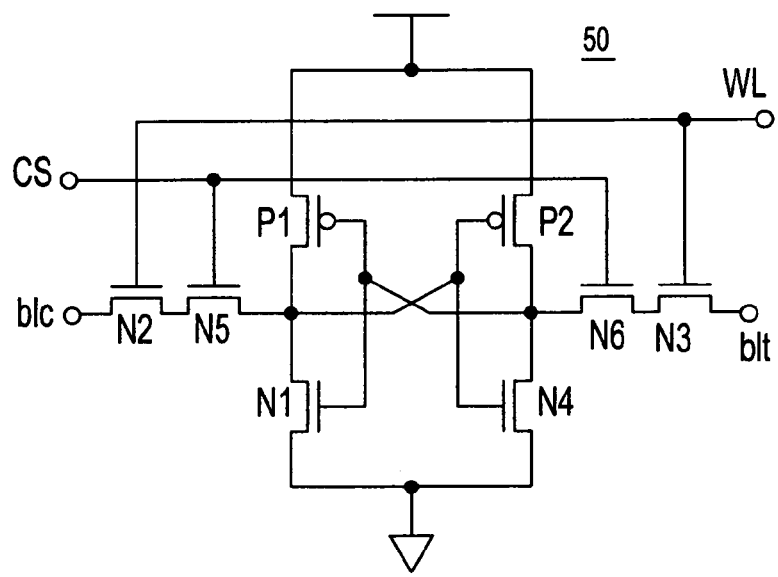
FIG. 3 illustrates an 8-T SRAM cell of improved stability according to one embodiment of the present invention.

More specifically, in a first embodiment as shown in FIG. 3, the present invention provides a novel 8-T SRAM cell structure 50 that adds two passgates N5, N6 to control column select.

Figure 1:
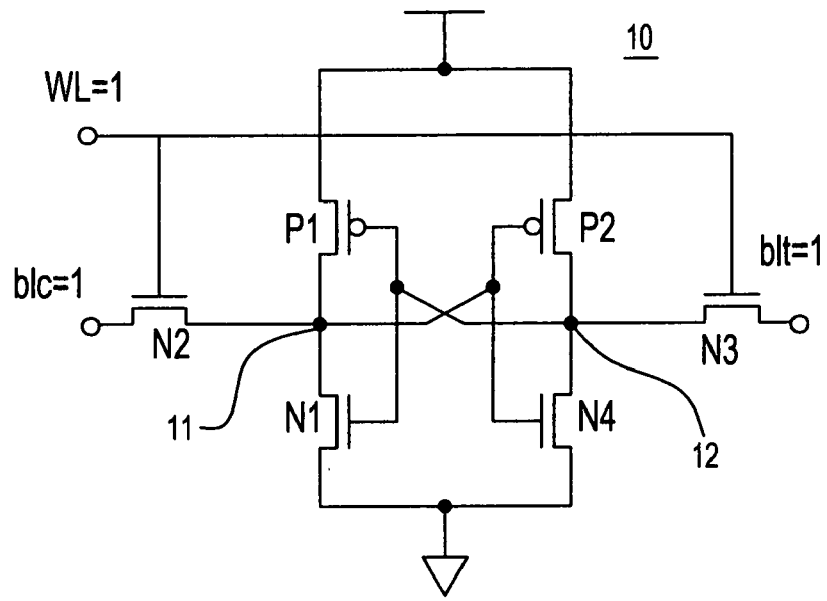
FIG. 1 shows a conventional 6T-SRAM cell according to the prior art.
Figure 2:
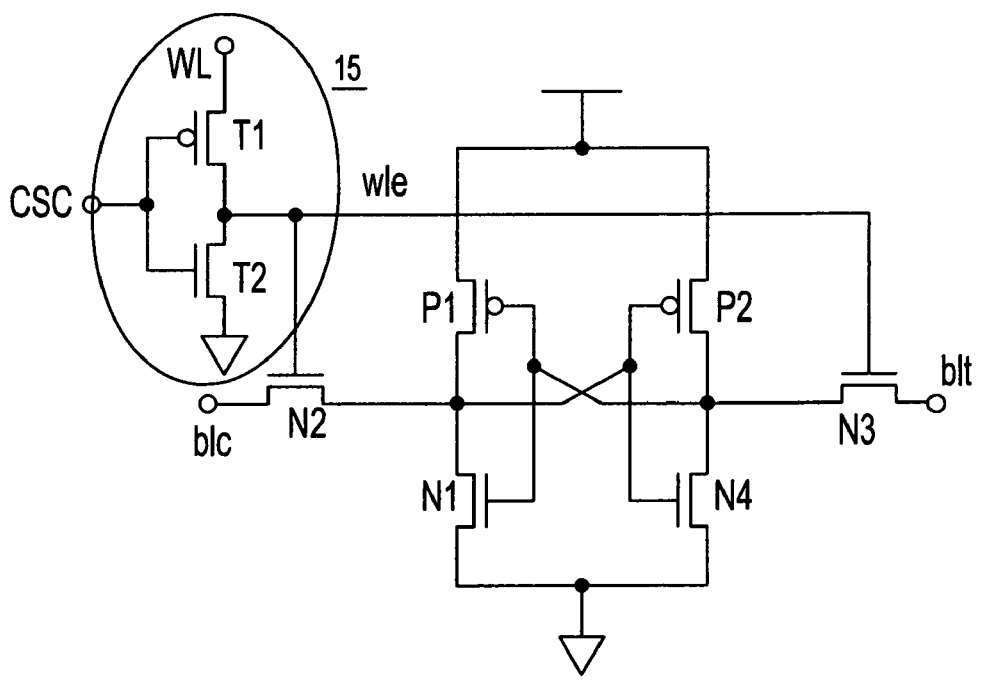
FIG. 2 illustrates a prior art 8-T SRAM cell design according to the prior art.

As shown in FIG. 3, one additional passgate N5 is a FET (e.g., NFET) in series connection with passgate N2, and the other additional passgate N6 (e.g., NFET) is in series connection with passgate N3. Each passgate N5 and N6 includes a respective gate terminal that is connected to receive the column select signal (CS). As in the embodiment of FIG. 1, original passgates N2 and N3 transistors include respective gate terminals that are connected to receive the Word Line (Row) select signal (WL). The additional two passgate transistors N5 and N6 provide SRAM cell 50 operation implementing logic such as depicted in Table 2. As seen from Table 2, the problem associated with the prior art approach of FIG. 2, i.e., that of a floating inverter output (wle), is avoided when both CS and WL are both "0" in the embodiment depicted in FIG. 3. Elimination of this floating node avoids the passgate leakage during the time the cell is not selected (CS=WL=0).

TABLE 2

| CSC | WL | Operation |
|---|---|---|
| 0 | 0 | Col/Row unsel |
| 0 | 1 | Col unsel/Row sel |

TABLE 2-continued

| CSC | WL | Operation |
|---|---|---|
| 1 | 0 | Col selec/Row unsel |
| 1 | 1 | Col/Row sel |

Figure 4:
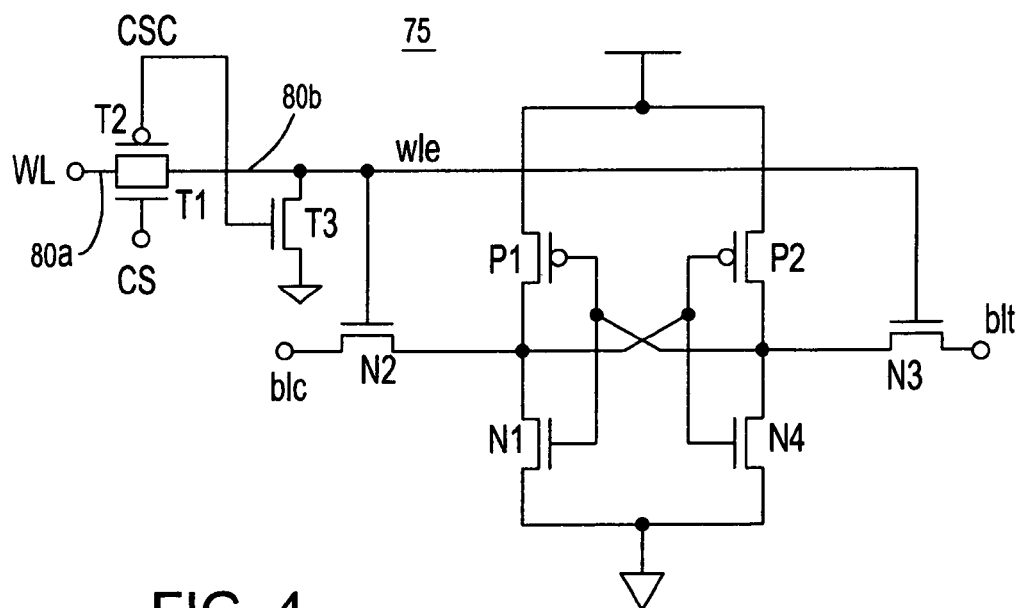
FIG. 4 illustrates an 9-T SRAM cell of improved stability according to another embodiment of the present invention; and, FIG. 5 presents a top-down view of an exemplary 6-T SRAM cell layout which contains active regions, isolation regions, gate structures, and contact structures that may be used to form the metal oxide semiconductor (MOS) transistors in a complementary metal oxide semiconductor (CMOS) SRAM cell operable in conjunction with the embodiments of the invention.

In a second embodiment of the invention as shown in FIG. 4, there is provided a novel 9-T SRAM cell structure 75 that adds three additional transistors to the 6-T SRAM cell structure. As shown in FIG. 4, the three transistors perform an ANDING function to separate row select (WL) and column select (CS) signals.

Particularly, as shown in FIG. 4, a first, second and third transistors T1 (e.g., NFET) and T2 (e.g., PFET) and T3 provide an AND or "Transmission Gate" type function providing SRAM cell 75 operation implementing logic such as depicted in Table 3 herein. Transistor T1 and complementary transistor T2 are connected in parallel such that respective source or drain terminals of T1 are connected with respective source and drain (or, drain and source terminals) of complementary transistor T2. The common terminal 80a connecting parallel connected transistors T1, T2 receives the row select (WL) signal. The other common terminal 80b connecting parallel connected transistors T1, T2 provides a non-floating output (wle) signal according to the improved SRAM cell functionality according to the present invention. The gate terminal of added transistor T1 is connected to the column select signal line for receiving the column select signal (CS) while the gate terminal of parallel connected added transistor T2 is connected to receive the complementary column select signal CSC (i.e., $\overline{CS}$). The CSC signal provided at the gate of T2 is additionally connected to control operation of the third added transistor T3 and is connected to the gate of T3 for controlling operation of this gate. The gate of transistor T3 is operable for providing definite logic signals 0 or 1 at the wle node depending upon the state of the WL signal and CSC signals. Thus, as shown in Table 3, when the CS=0 the CSC=1 and the wle node will always remain at the logic low (0 bit); likewise, when CS=1 the CSC=0, the wle node will track the logic state of the row select (WL). As can be seen, the provision of the transmission gate ANDING approach in the 9-T SRAM 75 cell of FIG. 3 eliminates the internal floating node (wle) as compared to known solutions.

TABLE 3

| CS | WL | wle | Operation |
|---|---|---|---|
| 0 | 0 | 0 | Col/Row unsel |
| 0 | 1 | 0 | Col unsel/Row sel |
| 1 | 0 | 0 | Col selec/Row unsel |
| 1 | 1 | 1 | Col/Row sel |

Thus, in one embodiment, an 8T SRAM cell structure implements a "Series Gating" feature for implementing Column Select (CS) and Row Select (WL) cell storage access. Particularly, the 8-T approach adds two passgates, two series connected transistor devices connected at complementary nodes of two cross-coupled inverters, to control column select and word select.

In the other embodiment, a 9T SRAM cell structure includes a "Transmission Gate" to implement Column Select (CS) and Row Select (WL). The 9-T approach adds three transistors to perform ANDING function to separate the row select and column select signal functions. Both methods improve stability by eliminating half-select mode and facilitate rail to rail data transfer in and out of the cell with less disturbing data transfer. The ANDING function in the 9-T approach eliminates the internal floating node (wle) as compared to known solutions.

The present invention may be implemented for use with a SRAM cell structure that contains pull-down transistors and pass-gate transistors of substantially similar channel widths, which are suitable for fabrication using advanced lithography technology. Such a SRAM cell is concurrently characterized by a beta ratio of at least about 1.5, preferably from about 1.8 to 3, more preferably from about 2 to about 3, and most preferably from about 2.5 to about 3, which ensures further stability of the SRAM cell.

Figure 5:
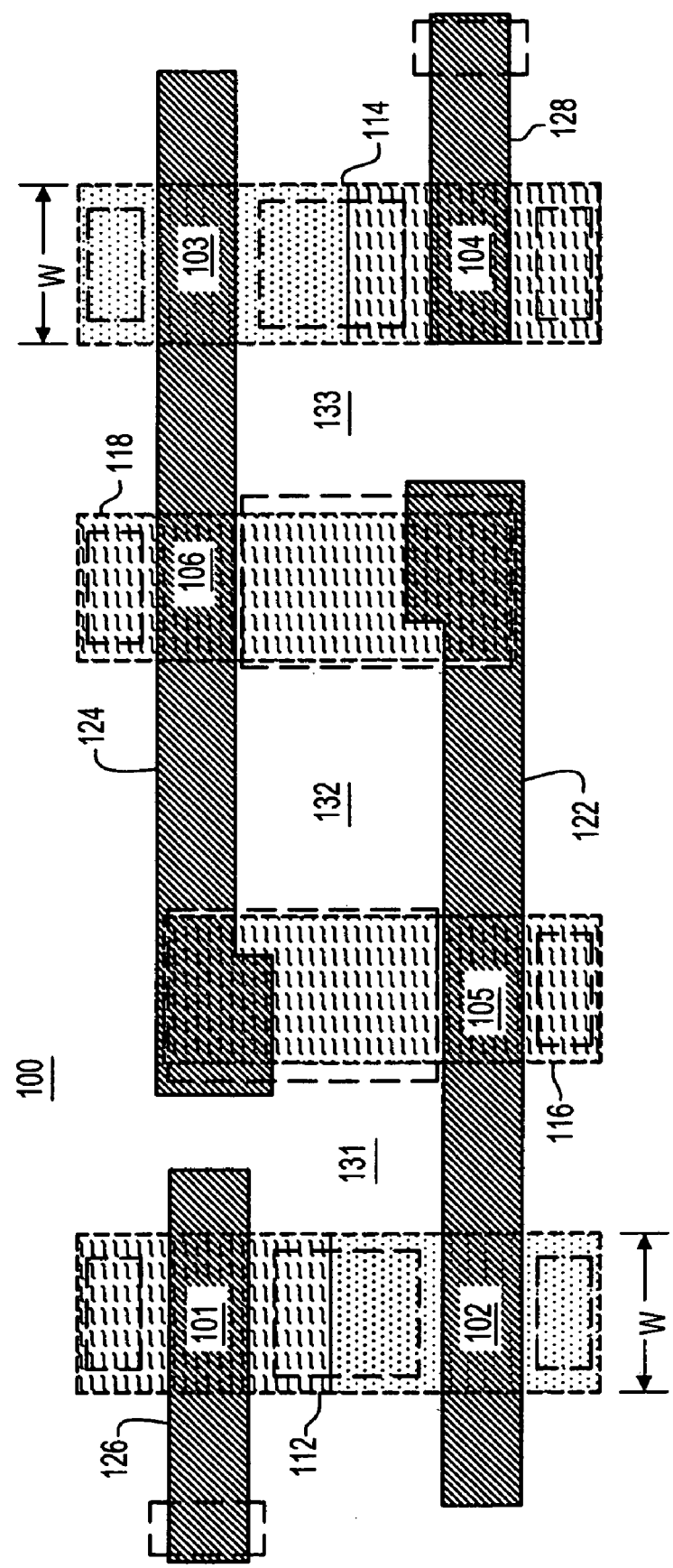

FIG. 5 presents a top-down view of an exemplary 6-T SRAM cell layout 100, which contains the active regions, isolation regions, gate structures, and contact structures that may be used to form the metal oxide semiconductor (MOS) transistors in a typical complementary metal oxide semiconductor (CMOS) SRAM cell. The exemplary SRAM cell of the present invention may be fabricated in a conventional semiconductor substrate or, a hybrid crystal orientation substrates having at least a first set of regions and a second set of regions, and wherein carrier mobility in the second set of regions differentiates from that in the first set of regions, such as described in commonly-owned, co-pending U.S. patent application Ser. No. 11/162,780 [Atty Docket 18552] the whole contents and disclosure of which is incorporated by reference as if fully set forth herein. Such hybrid crystal orientation substrate may comprise an upper semiconductor layer (not shown) having a first crystal orientation and a lower semiconductor layer (not shown) having a second, different crystal orientation that are provided and bonded together to form a bonded substrate.

The upper and lower semiconductor material layers may comprise any semiconductor material, including, but not limited to: Si, SiC, SiGe, SiGeC, Ge alloys, GaAs, InAs, InP, as well as other III-V or II-VI compound semiconductors. Such semiconductor layers may comprise a doped or undoped bulk wafer, a bulk wafer containing an ion implanted region, such as an $H_2$ implant region that can be used to split a portion of such wafer, a preformed SOI wafer, or a layered semiconductor structure such as, for example, Si/SiGe. In one preferred embodiment, both the upper and lower semiconductor layers comprise a Si-containing semiconductor material.

Specifically, as shown in FIG. 5, pass-gate transistors 101 and pull-down transistors 102 are formed within a connected active region 112, with no isolation therebetween, and pull-down transistors 103 and pass-gate transistors 104 are formed within a connected active region 114. Further, pull-up transistors 105 and 106 are formed within active regions 116 and 118. The active regions 112, 114, 116, and 118 are formed within a semiconductor substrate, preferably be a silicon-containing substrate, and are separated from one another by dielectric isolation regions 131-133. Gate structures 122 and 126 are arranged above active region 112 to form gates of pull-down transistor 102 and pass-gate transistor 101, respectively. Similarly, above active region 114, gate structures 124 and 128 are arranged to form gates of pull-down transistor 103 and pass-gate transistor 104, respectively. Consequently, active regions 116 and 118 each have two gate structures 122 and 124 arranged above them.

In the embodiment of FIG. 5, the active region 112 (or 114) that forms the pass-gate transistor 101 (or 104) and the pull-down transistor 102 (or 103) have a first region of a first crystal orientation and a second region of a second crystal orientation, i.e., the respective active regions of the pass-gate transistor 101 (or 104) and the pull-down transistor 102 (or 103), although connected, have different crystal orientations. For example, if the pass-gate transistor 101 (or 104) and the pull-down transistor 102 (or 103) are nFETs, the pass-gate transistor region should have a crystal orientation (such as the (110) surface in silicon) that degrades electron mobility, and the pull-down transistor region should have a crystal orientation (such as the (100) surface in silicon) that enhances electron mobility. On the other hand, when the pass-gate transistor 101 (or 104) and the pull-down transistor 102 (or 103) are pFETs, the pass-gate transistor region should have a crystal orientation (such as the (100) surface in silicon) that degrades hole mobility, and the pull-down transistor region should have a crystal orientation (such as the (110) surface in silicon) that enhances hole mobility.

In such a manner, a carrier mobility differential is provided between the pass-gate transistor 101 (or 104) and the pull-down transistor 102 (or 103). The active regions 112 and 114 can therefore have the same channel width W throughout the entire length, without comprising the cell stability of the SRAM device.

The pull-up transistors 105 and 106 can be fabricated on semiconductor regions of any crystal orientation. For maximum cell performance, it is preferred that such pull-up transistors are formed in semiconductor regions having a crystal orientation that enhances the mobility of the specific type of charge carriers in such pull-up transistors. For example, if the pull-up transistors are pFETs, they should be formed in semiconductor regions having a crystal orientation (such as the (110) surface in silicon) that enhances hole mobility. On the other hand, if the pull-up transistors are nFETs, they should be formed in semiconductor regions having a crystal orientation (such as the (100) surface in silicon) that enhances electron mobility.

The following additional U.S. patent applications describing SRAM cells of enhanced stability for use with the invention are incorporated herein by reference in their entireties for all purposes: U.S. Patent Application Publication Nos. US 2005/0073874A1, US 2005/0063232A1, US 2005/0047196A1, US 2004/0032761A1 and US 2003/0012067A1. Additional US Patents describing SRAM cell structures and memory devices of enhanced stability include: U.S. Pat. No. 6,934,182, U.S. Pat. No. 6,920,061, U.S. Pat. No. 6,888,741, U.S. Pat. No. 6,552,941, U.S. Pat. No. 6,507,511, U. disclosure and contents of each being incorporated by reference as if fully set forth herein.

Although the above description is provided primarily in terms of planar SRAM cell structures, for simplicity and illustration purposes only, the present invention is not limited to planar SRAM cells, but is broadly applicable to other SRAM cell structures, such as vertical SRAM cells and trenched SRAM cells, with or without modifications and variations, as readily determinable by a person ordinarily skilled in the art according to the principles described herein. Various transistors as mentioned hereinabove can be readily prepared using conventional CMOS processing techniques that are well known to those skilled in the art, and therefore details concerning their fabrication are not provided herein.

While the invention has been described herein with reference to specific embodiments, features and aspects, it will be recognized that the invention is not thus limited, but rather extends in utility to other modifications, variations, applications, and embodiments, and accordingly all such other modifications, variations, applications, and embodiments are to be regarded as being within the spirit and scope of the invention.

What is claimed is:

1. A semiconductor device comprising at least one SRAM cell located in a substrate, wherein said at least one SRAM cell comprises two pull-up transistors and two pull-down transistors in cross-coupled inverter configuration for storing a single data bit, said device further comprising:
   first and second pass-gate transistor devices, each having a gate terminal operable to receive a first signal for controlling access to a stored data bit;
   a first switch device in series connection with one of the first or second pass-gate transistor device operable for receiving a second signal for controlling access to said stored data bit;
   a second switch device in series connection with the other of said first or second pass-gate transistor device operable for receiving said second signal for controlling access to said stored data bit;
   wherein provision of said first and second series connected switch devices prevent half-select mode operation.

2. The semiconductor device as claimed in claim 1, comprising an array of SRAM cells along rows and columns, wherein said first signal provides access control to a SRAM cell along a column and said second signal provides access control to said SRAM cell along a row.

3. The semiconductor device as claimed in claim 1, wherein said first switch device comprises a third pass-gate transistor having gate terminal operable for receiving said second signal.

4. The semiconductor device as claimed in claim 2, wherein said second switch device comprises a fourth pass-gate transistor having gate terminal operable for receiving said second signal.

5. The semiconductor device as claimed in claim 4, wherein provision of said third and fourth series connected pass-gate transistor devices prevent accessing the cell when any one of the column or row is not selected.

6. The semiconductor device as claimed in claim 1, wherein access to said stored data bit is read access.

7. The semiconductor device as claimed in claim 1, wherein access to said stored data bit is a write access.

8. A semiconductor device comprising at least one SRAM cell located in a substrate, wherein said at least one SRAM cell comprises two pull-up transistors and two pull-down transistors in cross-coupled inverter configuration between a power supply voltage and a ground, for storing a single data bit, said device further comprising:
   first and second pass-gate transistor devices, each having a gate terminal operable to receive a single control signal for controlling access to a stored data bit;
   means responsive to first and second signals for generating said single control signal in a manner to prevent half-select mode operation.

9. The semiconductor device as claimed in claim 8, wherein said means responsive to first and second signals comprises a transmission gate.

10. The semiconductor device as claimed in claim 8, wherein said means responsive to first and second control signals comprises:
    a parallel connection of two transistor devices, a first of said parallel connected transistor devices including a gate terminal for receiving said first signal, a second transistor of said parallel connected transistor devices including a gate terminal for receiving a complement of said first signal, a first terminal of each said parallel connected transistor devices receiving said second signal, and a second terminal of each said parallel connected transistor devices connected to said gate terminals of each said first and second pass-gate transistor devices for providing said single control signal; and a third transistor device having a gate terminal operable for receiving said complement of said first signal, and, having a first terminal connected to said gate terminals of each said first and second pass-gate transistor devices, and a third terminal connected to said ground.

11. The semiconductor device as claimed in claim 8, comprising an array of SRAM cells along rows and columns, wherein said first signal (CS) provides access control to a SRAM cell along a column and, said second signal (WL) provides access control to a SRAM cell along a row.

12. The semiconductor device as claimed in claim 8, wherein provision of said means responsive to first and second control signals eliminate existence of a floating said gate terminals of each said first and second pass-gate transistor devices.

13. The semiconductor device as claimed in claim 8, wherein access to said stored data bit is read access.

14. The semiconductor device as claimed in claim 8, wherein access to said stored data bit is a write access.

15. The semiconductor device as claimed in claim 11, wherein said row select (WL) and column select (CS) signal inputs are asserted to select Row (Row) and column (Col) access to a bit stored at a SRAM cell according to the following table:

| CS | WL | wle | Operation |
|---|---|---|---|
| 0 | 0 | 0 | Col/Row unsel |
| 0 | 1 | 0 | Col unsel/Row sel |
| 1 | 0 | 0 | Col selec/Row unsel |
| 1 | 1 | 1 | Col/Row sel | wherein provision of said means responsive to first and second signals for generating said single control signal prevent existence of floating gate terminals of each said first and second pass-gate transistor devices, thereby enhancing SRAM cell stability.

16. A memory device comprising an array of SRAM cells, said array having row select and column select signal inputs controlling access to a bit stored at a SRAM cell structure of said array, said SRAM cell structure comprising, at each a first and a complement side of said SRAM cell structure, a series connection of two pass-gate transistors for enabling access to said stored bit, wherein a first transistor of said series-connected pass-gate transistors receives said column select (CSC) signal, and a second transistor of each said series-connected pass-gate transistors receives said row select (WL) signal, for enabling bit access.

17. The memory device as claimed in claim 16, wherein said SRAM cell structure comprises: two pull-up transistors and two pull-down transistors in cross-coupled inverter configuration for storing a single data bit, each said series connection of two pass-gate transistors coupled at a bit and complement bit side of each cross-coupled inverter configuration.

18. The memory device as claimed in claim 16, wherein said row select (WL) and column select (CSC) signal inputs are asserted to select column (Col) and Row (Row) access to a bit stored at a SRAM cell according to the following table:

| CSC | WL | Operation |
|---|---|---|
| 0 | 0 | Col/Row unsel |
| 0 | 1 | Col unsel/Row sel |
| 1 | 0 | Col selec/Row unsel |
| 1 | 1 | Col/Row sel | wherein provision of said series connection of two pass-gate transistors coupled at a bit and complement bit side prevent existence of floating gate terminals of each said first and second pass-gate transistor devices, thereby enhancing SRAM cell stability.

* * * * *